United States Patent [19]

Seiler

[11] Patent Number: 4,591,826
[45] Date of Patent: May 27, 1986

[54] GRAY CODE DAC LADDER

[75] Inventor: Norman C. Seiler, West Melbourne, Fla.

[73] Assignee: Harris Corporation, Melbourne, Fla.

[21] Appl. No.: 620,728

[22] Filed: Jun. 14, 1984

[51] Int. Cl.[4] ............................................. H03M 1/66
[52] U.S. Cl. ............................................. 340/347 DA
[58] Field of Search .................................. 340/347 DA

[56] References Cited

U.S. PATENT DOCUMENTS

| 2,782,408 | 2/1957 | Fisher | 340/347 DA |
| 2,803,003 | 8/1957 | Pfeiffer | 340/347 DA |
| 2,986,727 | 5/1961 | Macklem | 340/347 DA |
| 3,504,360 | 3/1970 | Vosbury et al. | 340/347 DA |
| 3,810,158 | 5/1974 | Murakami et al. | 340/347 DA |
| 3,997,892 | 12/1976 | Susset | 340/347 DA |
| 4,146,882 | 3/1979 | Hoff, Jr. et al. | 340/347 DA |

FOREIGN PATENT DOCUMENTS

WO81/00653  3/1981  PCT Int'l Appl. ......... 340/347 DA

Primary Examiner—Charles D. Miller
Attorney, Agent, or Firm—Barnes & Thornburg

[57] ABSTRACT

A Gray code digital to analog converter having an inherently monotonic and an not inherently monotonic embodiments. The inherently monotonic embodiment connects a first end terminal of a ladder stage to the intermediate terminal of a previous stage and switches the second end terminal between the end terminal of the previous stage. In the not inherently monotonic embodiment, the ladder is an R-2R ladder wherein the end terminals of the stage are switched by a double pole, single throw switch between an end terminal and an intermediate terminal of the previous stage.

8 Claims, 8 Drawing Figures

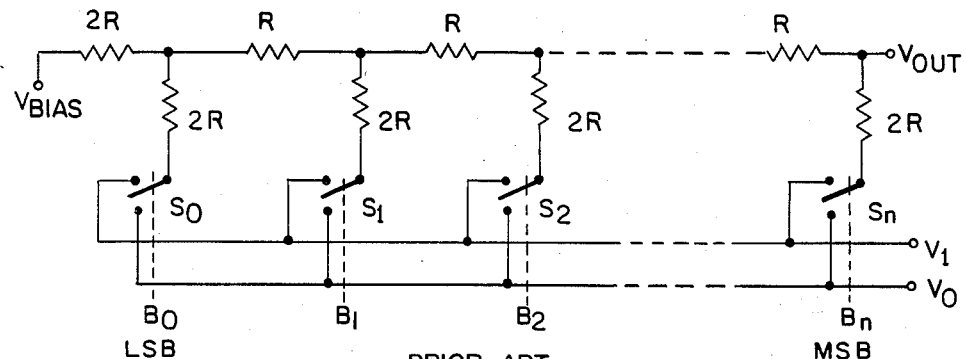
PRIOR ART
FIG. 1
| $B_2$ | $B_1$ | $B_0$ | $V_{OUT}$ |
|---|---|---|---|
| 0 | 0 | 0 | 1/8 |
| 0 | 0 | 1 | 2/8 |
| 0 | 1 | 0 | 3/8 |
| 0 | 1 | 1 | 4/8 |
| 1 | 0 | 0 | 5/8 |
| 1 | 0 | 1 | 6/8 |
| 1 | 1 | 0 | 7/8 |
| 1 | 1 | 1 | 1 |
PRIOR ART
FIG. 2
| $B_0$ | $B_1$ | $B_2$ | $X_0$ | $X_1$ | $X_2$ | $V_{OUT}$ |
|---|---|---|---|---|---|---|
| 0 | 0 | 0 | 1/2 | 1/4 | 1/8 | 1/16 |
| 0 | 0 | 1 | 1/2 | 1/4 | 1/8 | 3/16 |
| 0 | 1 | 1 | 1/2 | 1/4 | 3/8 | 5/16 |
| 0 | 1 | 0 | 1/2 | 1/4 | 3/8 | 7/16 |
| 1 | 1 | 0 | 1/2 | 3/4 | 5/8 | 9/16 |
| 1 | 1 | 1 | 1/2 | 3/4 | 5/8 | 11/16 |
| 1 | 0 | 1 | 1/2 | 3/4 | 7/8 | 13/16 |
| 1 | 0 | 0 | 1/2 | 3/4 | 7/8 | 15/16 |
FOR $Ri_1 = Ri_2$ AND $V_i = \frac{1}{2}(V_1 - V_0)$ $V_0 = 0, V_1 = 1$
FIG. 4
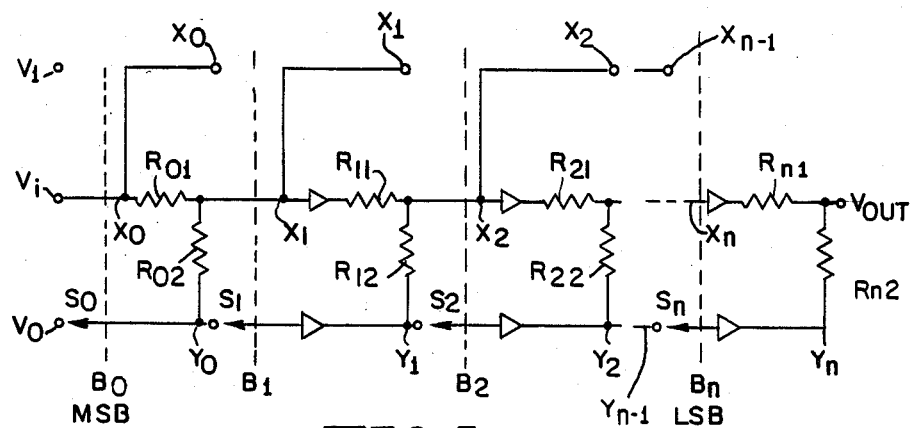
FIG. 3

| $B_0$ | $B_1$ | $X_0$ | $X_1$ | $V_{OUT}$ |
|---|---|---|---|---|
| 0 | 0 | 1/2 | 2/6 | 4/18 |
| 0 | 1 | 1/2 | 2/6 | 7/18 |
| 1 | 1 | 1/2 | 4/6 | 11/18 |
| 1 | 0 | 1/2 | 4/6 | 14/18 |

FOR $R_{i2} = 2 R_{i1}$ AND $V_i = 1/2 (V_1 - V_0)$, $V_0 = 0$, $V_1 = 1$

| $B_0$ | $B_1$ | $X_0$ | $X_1$ | $V_{OUT}$ |
|---|---|---|---|---|
| 0 | 0 | 1/3 | 2/9 | 4/45 |
| 0 | 1 | 1/3 | 2/9 | 13/45 |
| 1 | 1 | 1/3 | 5/9 | 19/45 |
| 1 | 0 | 1/3 | 5/9 | 37/45 |

FOR $R_{02} = 2 R_{01}$, $R_{11} = 3/2 R_{12}$, $V_i = 1/3(V_1 - V_0)$, $V_0 = 0$, $V_1 = 1$

| $B_0$ | $B_1$ | $B_2$ | $X_0$ | $X_1$ | $X_2$ | $V_{OUT}$ |
|---|---|---|---|---|---|---|
| 0 | 0 | 0 | 1 | 1/2 | 1/4 | 1/16 |
| 0 | 0 | 1 | 1 | 1/2 | 0 | 3/16 |
| 0 | 1 | 1 | 1 | 0 | 1/2 | 5/16 |
| 0 | 1 | 0 | 1 | 0 | 1/4 | 7/16 |
| 1 | 1 | 0 | 0 | 1 | 3/4 | 9/16 |
| 1 | 1 | 1 | 0 | 1 | 1/2 | 11/16 |
| 1 | 0 | 1 | 0 | 1/2 | 1 | 13/16 |
| 1 | 0 | 0 | 0 | 1/2 | 3/4 | 15/16 |

GRAY CODE DAC LADDER

BACKGROUND AND SUMMARY OF THE INVENTION

The present invention relates generally to digital to analog converters and more specifically to an improved Gray code digital to analog converter.

The most common form of electrical digital to analog (D/A) converter is the switched R-2R ladder. It is simple and relatively inexpensive, consisting of a fixed reference voltage and for each ladder stage, providing conversion for each bit of the input digital word, two resistors and a single-pole, double-throw switch. A typical R-2R ladder D/A converter is shown in FIG. 1. Here, each switch switches between fixed logic "0" voltage $V_0$ and logic "1" voltage $V_1$ and by using series and shunt resistors R and 2R, and proper termination at the LSB to a reference voltage "$V_{BIAS}$", the ladder appears infinite in length. For any inputted binary code, an output voltage is developed at the MSB whose voltage level is related to the applied digital code by mapping the voltage level between $V_0$ and $V_1$ to the code words from all 0's to all 1's. A three stage ladder map is illustrated in FIG. 2.

This ladder will theoretically resolve code words of any length, but in practice is limited by the available precision of the ladder resistors. Ladder errors frequently are manifested by a condition known as non-monotonicity. If a code converter is monotonic, it's output will always increase for increasing values of input code, and vice versa. This condition is not always met with the binary code converters since it depends on the R-2R ratios of the ladder resistors being held to a precision proportional to the code convertor's quantization. For longer input words, more resistor precision is required.

A second problem with the binary R-2R ladder is the fact that it is binary weighted. Multiple switches must change state simultaneously for transitions between output states. For instance, when transiting midscale, the switches change from the MSB equal to 0 and all others equal to 1, to the MSB equal to 1 and all others equal to 0. Here, all switches change state. The switches themselves contribute electrical noise to the D/A converter output, and more noise is generated when more switches change state. These two effects, non-monoticity and ladder switching noise, limit the ultimate length of the R-2R converter.

This aspect of monotonicity is important, for in many applications resolution, and reduction in quantization noise, is more important than accuracy. A code converter which is monotonic will be more desirable for this type of application, since frequently the small-signal performance is of importance. An example is the emerging digital sound recording systems, in which an inexpensive coder converter with resolution to 14–16 bits are required to reproduce low-level passages. Low cost is important, for the intended consumer market. For a monotonic conventional binary coder, a 14–16 bit requirement could impose expensive requirements on resistor accuracy. Binary ladder switching noise is also a major drawback in this application for these code converters always operate with a signal centered at midscale, where the switching noise is maximum.

Thus, there is a need for a D/A ladder configuration, which should be inherently monotonic for any length, independent of ladder resistor accuracy. The network accuracy should only impact linearity, since overall linearity becomes of reduced importance in many applications, and the impact diminishes as signal level reduces.

These and other objects of the invention are attained by providing a digital to analog ladder configuration which is a Gray code converter to reduce switching noise and the switching points or voltages are within the ladder network and vary with the state of the ladder. In one configuration, the ladder is inherently monotonic and in another configuration the hardware required is minimized although no longer inherently monotonic. The inherently monotonic configuration includes for each stage a resistive network having first and second end terminals and a third terminal intermediate the first and second terminals. The first end terminal is connected to the third terminal of the previous stage and a switch selectively interconnects the second end terminal to either the second end terminal or third intermediate terminal of the preceding stage resistive network. The output terminal is connected to the third terminal of the last stage resistive network which is the least significant bit (LSB). The resistive values of the stages must be scaled in impedance or buffers may be used to prevent the resistive network of one stage from loading the previous stage. For the non-monotonic configuration, each resistive stage includes a switch which connects its first and second end terminals to either the second or third or third and second terminals, respectively of the preceding stage. The third terminal is selected such that it divides the resistive network into R and 2R resistances. The last stage from which the output is taken and which is the least significant bit has a resistive value of 2R and the third terminal of this last stage divides the resistors into a 0.5R and 1.5R resistances. In both configurations, the digital-to-analog converter is a Gray code converter. This reduces switching noises since only one switch at a time is changed for each step in the digital count.

Other objects, advantages and novel features of the present invention will become apparent from the following detailed description of the invention when considered in conjunction with the accompanying drawings.

BRIEF DESCRIPTION OF THE DRAWINGS

FIG. 1 is a schematic of a R-2R D/A ladder of the prior art.

FIG. 2 is a mapping table for a three stage ladder of FIG. 1.

FIG. 3 is a schematic of a monotonic Gray code D/A converter according to the principles of the present invention.

FIG. 4 is a mapping of a three stage D/A converter of FIG. 3 wherein the resistors of each stage are equal and the voltage $V_i$ is halfway between $V_0$ and $V_1$.

DETAILED DESCRIPTION OF THE DRAWINGS

Figures 5, 6, 7, 8:
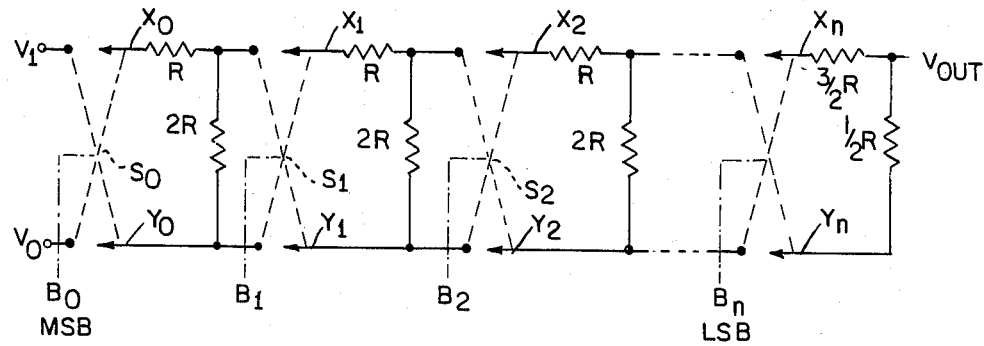
FIGS. 5 and 6 are maps of two stage converters of FIG. 3 with different resistive values and $V_i$ values.
FIG. 7 is a schematic of the non-monotonic Gray code D/A converter incorporting the principles of the present invention.
FIG. 8 is a mapping illustrating the principles of the FIG. 7 device.

The prior art D/A converter as illustrated in FIG. 1 includes a terminizing resistor 2R connected to the supply voltage $V_{BIAS}$ and to the least significant bit of the converter. Each stage includes an R-2R resistor arrangement with a switch S connecting the 2R leg to either a logic 0, voltage $V_0$ or a logic 1 voltage $V_1$. The output $V_{OUT}$ is taken off the most significant bit between the R-2R resistor. The mapping table for a three stage D/A converter of the prior art is illustrated in FIG. 2. As discussed above, it should be noted that in the transition for 4/8 to ⅜, all three of the bits change state requiring all three switches to change. This produces undesirable noise at the midrange point. Also, the structure without precision resistors is not monotonic.

A first type of D/A converter which is inherently monotonic is illustrated in FIG. 3. Each stage includes a resistive network including resistors $R_{i1}$ and $R_{i2}$. A first end of the resistive network for that stage $X_i$ is connected to the juncture of the resistors $R_1$ and $R_2$ of the previous stage and the other end $Y_i$ is controlled by a switch $S_i$ to switch between the $Y_{i-1}$ terminal and the $X_{i-1}$ terminal of the previous resistive stage. For the first stage $B_0$, which is the most significant bit, the first end $X_0$ is connected to $V_i$ which is a voltage intermediate the $V_0$ and $V_1$. The switch $S_0$ connects $Y_0$ between $V_0$ and $V_1$ in response to the digital input $B_0$. The output of the circuit is taken off the intermediate point or the juncture of $R_{n1}$ and $R_{n2}$ of the leaast significant bit $B_n$.

To prevent loading of a stage by subsequent stages, buffers are connected to the extremeties X and Y of each of the resistive networks except for the first network. Alternatively, the lack of loading may be achieved by selecting the resistance of one stage to be substantially greater than that of the previous stage. Thus, the effective resistance of the $R_{i2}$ resistor will be the $R_{i2}$ resistor instead of the parallel combination of $R_{i2}$ and $R_{i+11}$ and/or $R_{i+12}$.

To illustrate the monotonomicity of the structure of FIG. 3, a one bit decoder will be discussed. In a one bit decoder assuming that $V_i$ is ½ the difference of $V_1-V_0$ and that the resistive values $R_{01}$ and $R_{02}$ are equal, the two values of the decoder are ¼ and ¾ depending upon the position of the logic switch. When switch $S_0$ is connected to $V_0$. The output $V_{OUT}$ is halfway between the voltage $V_0$ and $V_i$ which is ¼. When the switch $S_0$ is connected to the $V_1$ position, the output $V_{OUT}$ is halfway between $V_i$ and $V_1$ which is ¾. By maintaining the terminal $X_0$ tied to $V_i$, and rotating the opposite end of the bridge, the voltage on the output in the first position has to be between 0 and 0.5 and in the one position, between 0.5 and 1 or $V_1$. Thus, monotonicity is assured irrespective of the actual values of $R_{01}$ and $R_{02}$.

A three stage D-to-A converter having the structure of FIG. 3 is mapped in the table of FIG. 4. The resistor values $R_{i1}$ and $R_{i2}$ are equal and the intermediate voltage $V_I$ is equal to ½ ($V_1-V_0$). As is noted, the $V_{OUT}$ is binarily weighted although the digital code for $B_0$, $B_1$ and $B_2$ is a Gray code. In the Gray code, only one bit at a time changes values and, thus, only one switch at a time has a transition. As can be seen from the mapping in Table 4, the output voltage $V_{OUT}$ varies between 1/16 and 15/16. The $X_0$ value is always tied to ½. The $Y_0$ will vary between $V_0$ and $V_1$ which causes $X_1$ to vary between ¼ and ¾. When $X_1$ is ¼, $X_2$ varies between ⅛ and ⅜ and when $X_1$ is ¾ $X_2$ varies between ⅝ and ⅞ always increasing.

To generalize the discussion to show monotonicity, we will consider the ith stage who output $X_{i+1}$ which has a range between $Y_{i-1}$ and $X_{i-1}$. This range is divided into two parts, namely $X_{i-1}$-$X_i$ and $X_i$-$Y_{i-1}$. With the switch $S_n$ in the logic 0 position shown in FIG. 3, $X_{i+1}$ is between $Y_{i-1}$ and $X_i$ and with the switch $S_n$ in the 1 position, $X_{i+1}$ is between $X_{i-1}$ and $X_i$. It should be noted that all stages preceding the ith stage must all have voltages within the range specified for the ith stage. This includes the output voltage $V_{OUT}$ since these criteria apply to all stages and, thus, the DAC ladder is inherently monotonic for any ladder length. The only limitation is that the ladder switches and the buffer amplifiers or the switches chosen must have negligable offset voltages.

Although the mapping of FIG. 4 uses midrange scaling, namely that the $V_i$ intermediate is ½ ($V_1-V_0$) and the resistive values in the legs are equal such that its voltage is centered between the two ends, the present system is capable of substantially any combination of values. For example, in the two stage mapping of FIG. 5, the resistive value $R_{i2}$ is equal to $2R_{il}$ to result in a configuration substantially similar to an R-2R ladder and the intermediate voltage $V_i$ equal to ½ ($V_1-V_0$).

For a DAC having the intermediate voltage $V_i$ other than ½ ($V_1-V_0$) and the intermediate terminal of the resistive circuits varying between stages is also possible. FIG. 6 illustrates the mapping for a two stage DAC wherein the first stage has a 2R-R relationship and the third stage has a 2R-3R relationship. As will be noted, in all the mappings of FIGS. 4, 5 and 6, the Gray code results in the binarily weighted values and monotonicity is maintained since one end is tied to the intermediate point of the previous stage. It should be noted that the values $V_0$, $V_i$ and $V_1$ may be provided from external pins to the DAC or may be generated internally by a voltage divider.

In some applications, the expense of providing two unity gain amplifiers per stage (except in the first stage) in combination with a single pole, double throw switch may be a cost effective limitation. Also, in some environments, the monotonic relationship is not as important. In order to address these problems, a circuit using an R-2R relationship which has reduced switching noise by using a Gray code is illustrated in FIG. 7. The DAC of FIG. 7 includes a plurality of stages, each having an intermediate terminal providing an R-2R ladder. The ends of the R-2R stage is connected between the intermediate terminal and the other end of the 2R terminal of the previous stage. The last stage or the most significant stage $B_0$ has its end connected directly to $V_0$ and $V_1$.

A switch $S_i$ for each stage allows the ends of the resistive circuits including the serial connection of R2-R to be connected to a first end and the intermediate point of the previous stage resistive network. The switch is in effect a double throw, double pole switch. The least significant stage, or the termination stage from which the output is taken at the intermediate point between the two ends has a resitive value between the ends of 2R and the output is taken at a point to provide the resistive stage into 1.5R and 0.5R legs.

By providing the ouput stage or the least significant stage be a value of 2R, the switching points looking to the right into the ladder is always the value R because the double throw, double pole resistive value does not change. Thus, the need for buffers are eliminated. Since the resistance looking into the ith stage is 2R and it is always across a resistor 2R, the total impedance on any leg is R. The loading on the switch at any stage is constant, independent of load. The load at each switch position halves for increasing stages. Thus, for a switch drop of $V_i$ at stage $B_i$, the drop at stage $V_{i+1}$ is $V_i$ over 2. Since the drop is constant at each stage, it can be compensated for by trimming the resistors appropriately. It should be noted that the trim is the same for all stages and, thus, the ladder design can be made parametric and each stage design is independent of ladder length.

The mapping of a three stage R-2R ladder according to the principles of FIG. 7 is illustrated in FIG. 8. The digital inputs are Gray code and the ouput is a binary weighted value identical to that of the mapping of FIG. 4 for a three stage embodiment of FIG. 3.

Although the embodiment of FIG. 7 removes the buffers and therefore some of the expense from that of FIG. 3, the circuit of FIG. 7 is not monotonic. It should also be noted that at some length, the number of stages of the embodiment of FIG. 7 requiring trim would become more expensive than the cost of the buffers and, thus, the buffered approach of FIG. 3 may be preferred for long length ladders.

Although one DAC is inherently monotonic while the other is not, they both provide Gray code switching as well as the output being on the least significant bit switching stage. This is to be contrasted with the conventional R-2R binary ladder of FIG. 1 which is not inherently monotonic, requires binary switching or more than one switch changing states for a transition and the output is the significant switching stage.

To better understand the operation of the present invention, the theory of Gray codes will be discussed. A Gray code is an N bit code which is 100% efficient, meaning all possible combinations of N bits are in the set of code states. But the code progression is such that the contiguous states are separated by only one bit change or switching. For conversion between the Gray code and binary code, it should be noted that the value for the ith bit of Gray code is equal to the exclusive OR of the ith bit of binary code and the i-1 bit of the binary code. Thus, the bit in the ith column of the Gray code is equal to the bit in the ith column of the binary code if the bit in the next higher order column is a 0, otherwise it is complemented to 1. Reviewing tables 4 and 8, it is evident that the embodiment of FIGS. 3 and 7 increase uniformly when the switch positions progress in accordance with the Gray code. This is because the switch contacts of one stage is a function of the state of the previous stage. In FIG. 3, this is achieved by tying one end of the bridge to the intermediate point of the previous stage and rotating the end point about the two end points of the previous stage. In the embodiment of FIG. 7, both end points are changed and are simultanously complemented when the previous stage is changed.

The circuitry of FIGS. 3 and 7 provide D/A ladders wherein the switching points are within the ladder versus external positions. The switching contact points or voltages within the ladder vary with the state of the ladder. This results by proper selection of the resistances with a binarily weighted ladder wherein the dependency of the switch voltage levels can be made to result in a progressively increasing output from a Gray code input. This is valuable as the Gray code is a minimum distance code and the ladder requires only one switch change for each state change. This results in a minimum number of noise and disturbances due to switch change states. Depending upon cost restraints and lengths, an inherently monotonic ladder may be provided as illustrated in FIG. 3 or a non-monotonic Gray decoder as in FIG. 7 may be provided.

From the preceding description of the preferred embodiments, it is evident that the objects of the invention are attained, and although the invention has been described and illustrated in detail, it is to be clearly understood that the same is by way of illustration and example only and is not to be taken by way of limitation. The spirit and scope of the invention are to be limited only by the terms of the appended claims.

What is claimed is:

1. A Gray code digital-to-analog converter having a plurlity of bit stages comprising:
a full scale terminal;
a zero scale terminal;
a first stage resistive means having first and second end terminals and a third terminal intermediate said first and second terminal;
first switch means responsive to a digital input for connecting said first and second end terminal of said first stage resistive means to either said full scale and zero scale terminals respectively or said zero scale and full scale terminals respectively;
a plurality of subsequent stage resistive means, each having first and second end terminals and a third terminal intermediate said first and second terminals;
a plurality of switch means each responsive to an individual digital input for connecting a first and second end terminal of a respective subsequent stage resistive means to either the second and third terminals respectively or the third and second terminals respectively of the preceding stage resistance means; and
an output terminal connected to the third terminal of the last subsequent stage resistive means.

2. A Gray code D/A converter according to claim 1, wherein said first stage resistive means is the most significant digital bit stage and said last stage resistive means is the least significant digital bit stage.

3. A Gray code D/A converter according to claim 1, wherein the resistance of said resitive means between said first and third terminals and between said second and third terminals are in a 1-to-2 ratio.

4. A Gray code D/A converter according to claim 3, wherein said last resistive means has a resistance between said first and third terminals equal to said resistance between said second and third terminals of a preceding stage, and the resistance of said last resistive means between said first and third terminals and between said second and third terminals are in a 3-to-1 ratio.

5. A digital to analog converter having a plurality of stages, each stage comprising:
a resistive means having first and second terminals and a third terminal intermediate said first and second terminal;
a switch means responsive to a digital input for connecting said first and second terminals of a stage to either the second and third terminals respectively or third and second terminals respectively of the preceding stage; and
an output terminal of said converter connecting to the third terminal of the last stage.

6. A digital to analog converter according to claim 5, wherein said first stage resistive means is the most significant digital bit stage and said last stage resistive means is the least significant digital bit stage.

7. A Gray code D/A converter according to claim 5, wherein the resistance of said resitive means between said first and third terminals and between said second and third terminals are in a 1-to-2 ratio.

8. A Gray code D/A converter according to claim 7, wherein said last resistive means has a resistance between said first and third terminals equal to said resistance between said second and third terminals of a preceding stage, and the resistance of said last resistive means between said first and third terminals and between said second and third terminals are in a 3-to-1 ratio.

* * * * *